(12) United States Patent
Babcock et al.

(10) Patent No.: US 7,217,322 B2
(45) Date of Patent: May 15, 2007

(54) METHOD OF FABRICATING AN EPITAXIAL SILICON-GERMANIUM LAYER AND AN INTEGRATED SEMICONDUCTOR DEVICE COMPRISING AN EPITAXIAL ARSENIC IN-SITU DOPED SILICON-GERMANIUM LAYER

(75) Inventors: Jeffrey A. Babcock, Sunnyvale, CA (US); Scott Balster, Munich (DE); Alfred Haeusler, Freising (DE); Angelo Pinto, Allen, TX (US); Manfred Schiekofer, Freising (DE); Philipp Steinmann, Unterschleissheim (DE); Badih El-Kareh, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/934,188

(22) Filed: Sep. 2, 2004

(65) Prior Publication Data
US 2005/0098093 A1 May 12, 2005

(30) Foreign Application Priority Data
Sep. 10, 2003 (DE) ................. 103 41 806

(51) Int. Cl.
*C30B 25/04* (2006.01)
(52) U.S. Cl. .................. 117/88; 117/89; 117/101; 117/102; 117/105; 117/935; 117/936
(58) Field of Classification Search ............... None
See application file for complete search history.

(56) References Cited

U.S. PATENT DOCUMENTS

| 6,346,452 | B1 | 2/2002 | Kabir et al. |
| 6,492,711 | B1 * | 12/2002 | Takagi et al. ............ 257/593 |
| 6,559,022 | B2 | 5/2003 | U'Ren |
| 6,787,793 | B2 * | 9/2004 | Yoshida ................... 257/19 |
| 6,838,359 | B2 * | 1/2005 | De Boer ................. 438/493 |
| 6,958,253 | B2 * | 10/2005 | Todd ....................... 438/47 |

FOREIGN PATENT DOCUMENTS

WO    WO 03/046947    12/2002

OTHER PUBLICATIONS

E. Suvar et al., "Influence of doping on thermal stability of Si/Sl$_{1-x}$Ge$_x$/Sl heterostructures," Material Science and Engineering B102 (2003) 53-57.

\* cited by examiner

*Primary Examiner*—Yogendra N. Gupta
*Assistant Examiner*—Maria Veronica Ewald
(74) *Attorney, Agent, or Firm*—Jacqueline J. Garner; W. James Brady, III; Frederick J. Telecky, Jr.

(57) ABSTRACT

A method of fabricating an epitaxial silicon-germanium layer for an integrated semiconductor device comprises the step of depositing an arsenic in-situ doped silicon-germanium layer, wherein arsenic and germanium are introduced subsequently into different regions of said silicon-germanium layer during deposition of said silicon-germanium layer. By separating arsenic from germanium any interaction between arsenic and germanium is avoided during deposition thereby allowing fabricating silicon-germanium layers with reproducible doping profiles.

15 Claims, 4 Drawing Sheets

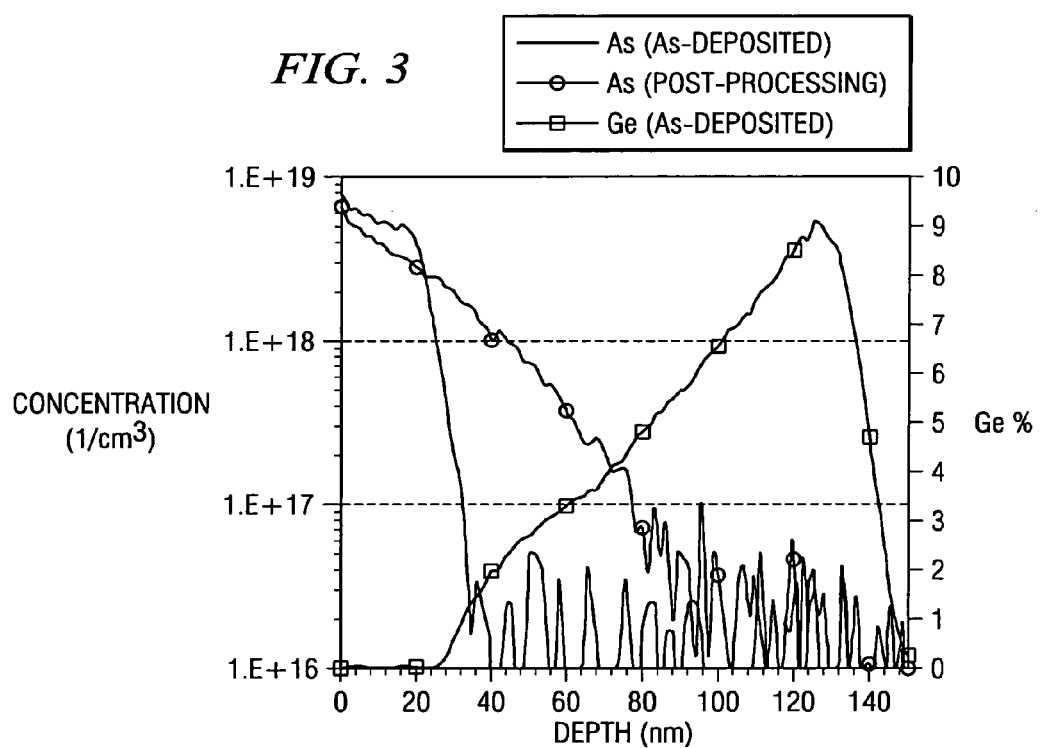
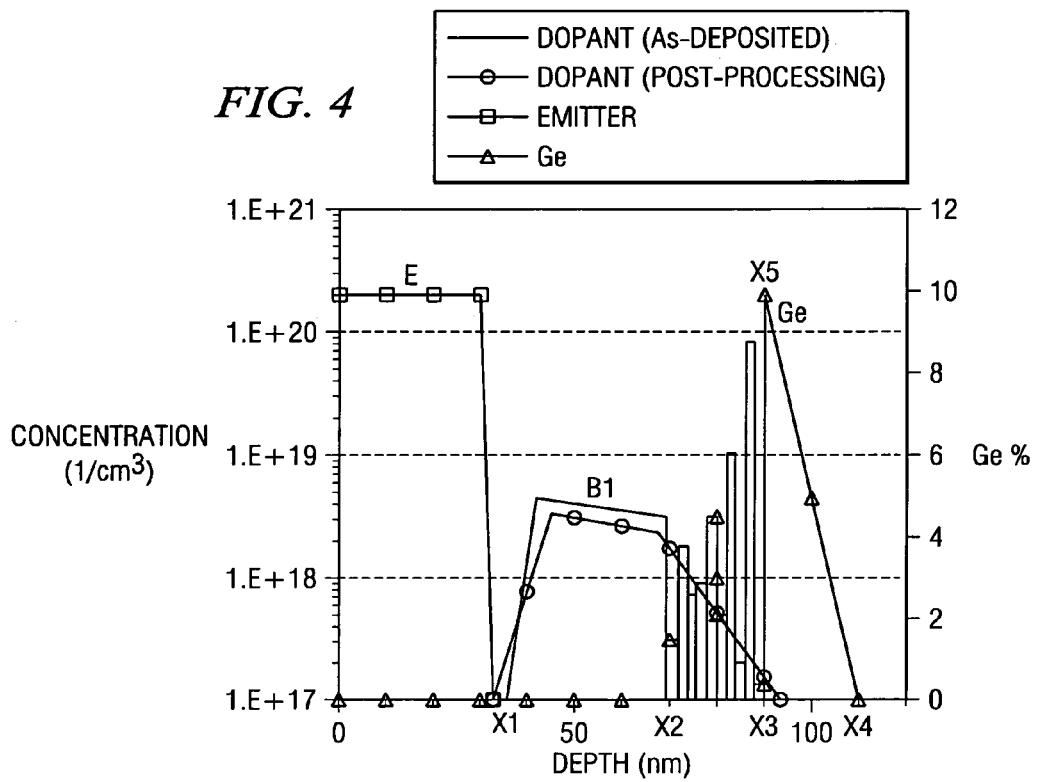

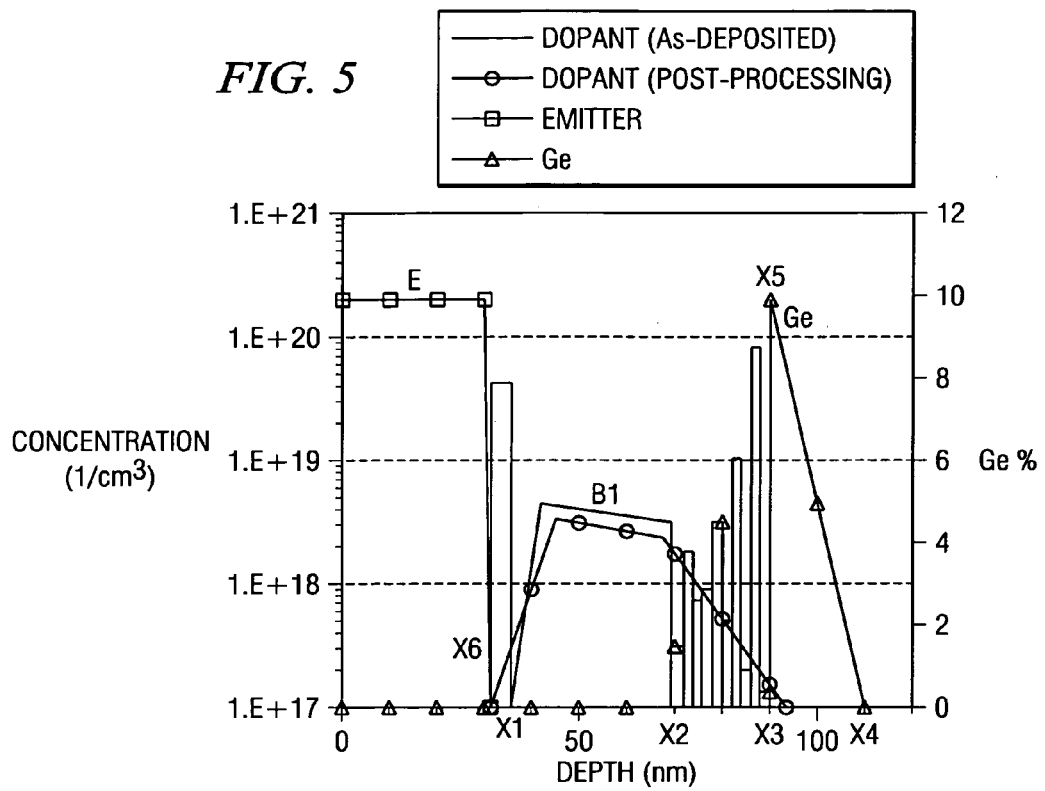
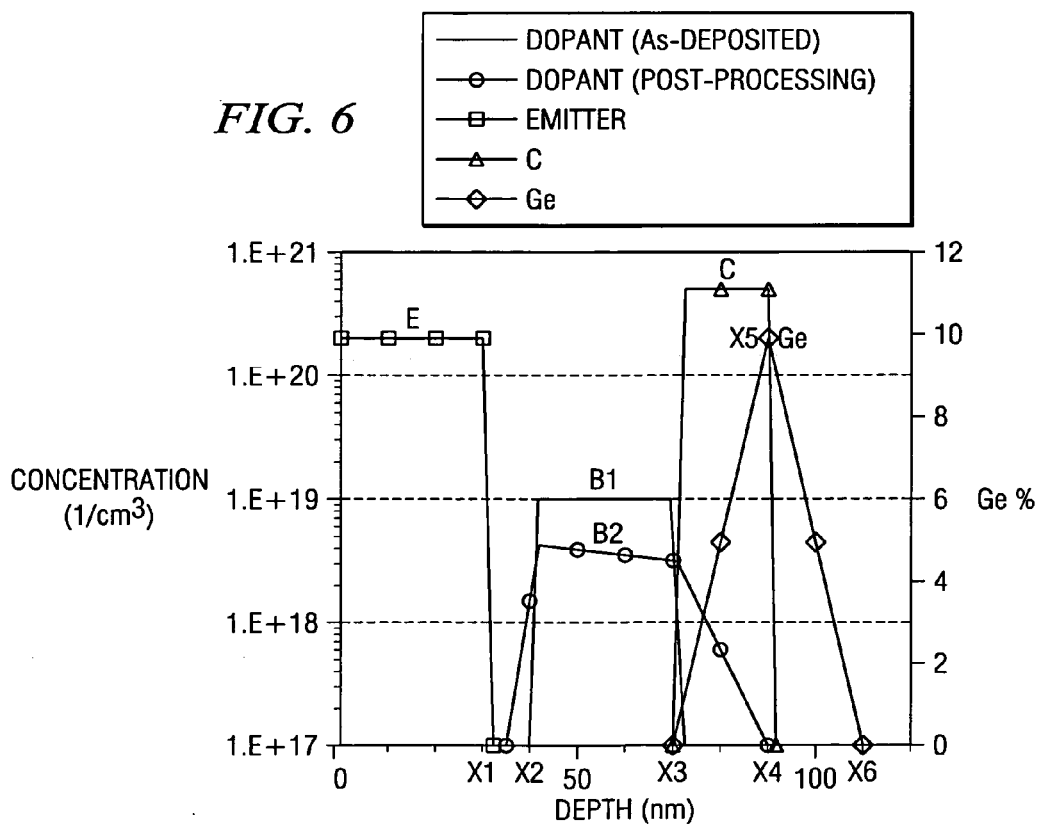

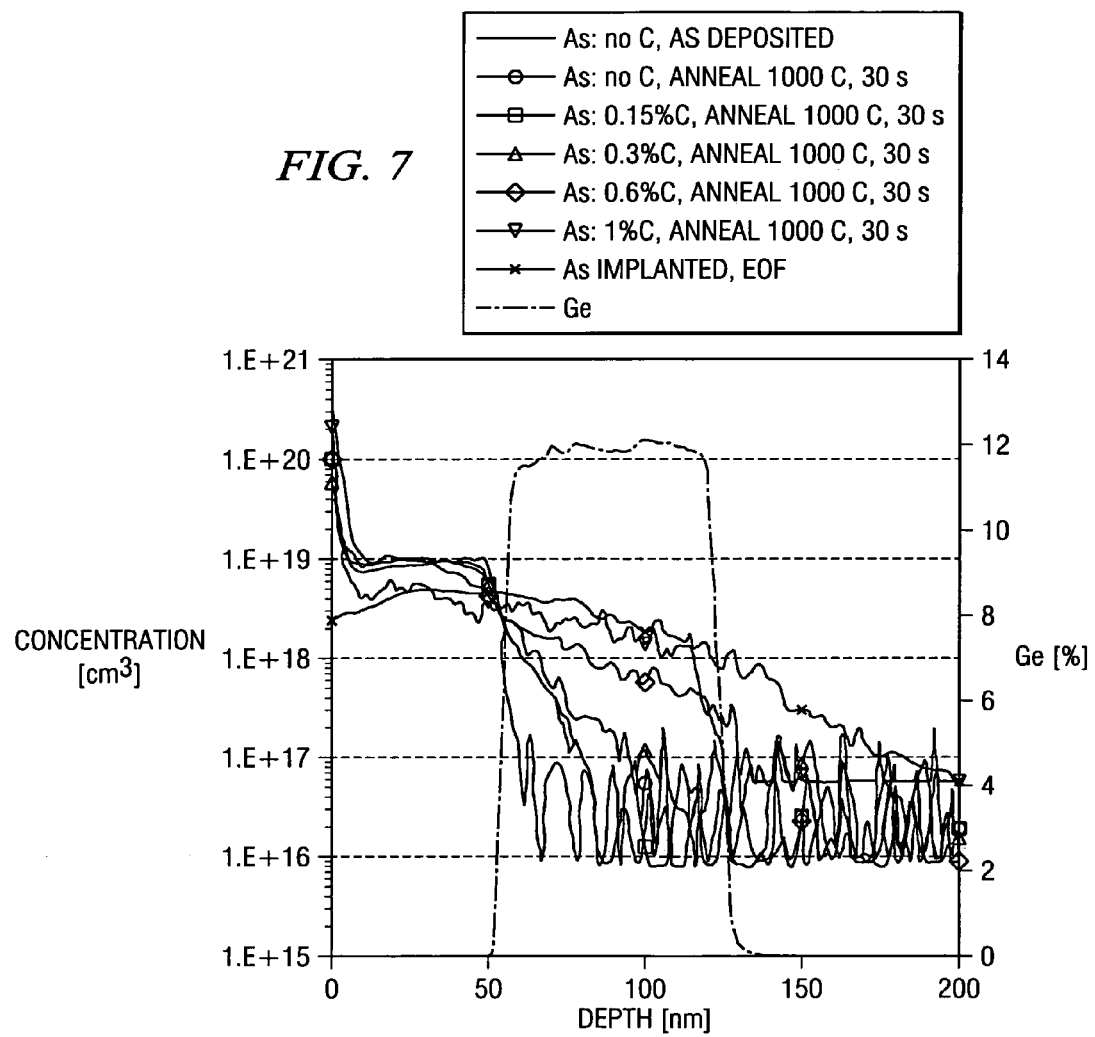

METHOD OF FABRICATING AN EPITAXIAL SILICON-GERMANIUM LAYER AND AN INTEGRATED SEMICONDUCTOR DEVICE COMPRISING AN EPITAXIAL ARSENIC IN-SITU DOPED SILICON-GERMANIUM LAYER

FIELD OF THE INVENTION

The present invention relates to a method of fabricating an epitaxial silicon-germanium layer for an integrated semiconductor device comprising the step of depositing an arsenic in-situ doped silicon-germanium layer. The present invention further relates to an integrated semiconductor device comprising an arsenic in-situ doped silicon-germanium layer.

BACKGROUND OF THE INVENTION

Silicon-germanium (SiGe) heterobipolar technology has generated worldwide interest for digital, analog and RF applications because it combines the transistor performance of III-V technologies with the manufacturability, high yield and low cost associated with conventional silicon integrated circuit (IC) fabrication. At present, SiGe technology development is mainly focused on npn SiGe heterobipolar transistors. However, for high-speed analog and mixed-signal circuit applications a complementary (npn and pnp) bipolar technology offers significant performance advantages over an npn-only technology. Push-pull circuits, for instance, ideally require a high-speed vertical pnp transistor with comparable performance to the npn transistor.

Because of the reduced mobility of holes on silicon, shallower base profiles are required for pnp heterobipolar transistors to achieve an AC performance comparable with that of an npn heterobipolar transistor. Due to the reduced diffusivity and high activation in silicon, arsenic should be the ideal dopant for ultra-shallow pnp SiGe epitaxial base layers. Typically, in epitaxial SiGe base layers the Ge profile overlaps with the dopant profile so that in order to have reproducible process results the interaction between the dopant and Ge has to be minimized. Unfortunately, in case of arsenic as a dopant it has turned out that there is a strong correlation of the arsenic concentration and the SiGe film growth-rate with arsenic flow for nearly all germanium concentrations which would be within the interest of typical silicon-germanium heterobipolar transistors, i.e. germanium concentrations between 1% and 15%.

SUMMARY OF THE INVENTION

The present invention provides a method of fabricating arsenic in-situ doped silicon-germanium layers with reproducible doping profiles by using typical epitaxial deposition tools.

According to the present invention arsenic (As) and germanium (Ge) are introduced subsequently into different regions of the silicon-germanium layer during deposition of the silicon-germanium layer. Arsenic and germanium are separated during the deposition process thus avoiding any interaction between these two elements during the deposition process. Consequently, the process according to the present invention allows fabricating As in-situ doped SiGe layers with reproducible doping profiles by using conventional deposition tools, e.g. a RPCVD (reduced pressure chemical vapor deposition) reactor.

The present invention further provides integrated semiconductor devices comprising epitaxial arsenic in-situ doped silicon-germanium layers fabricated by using conventional epitaxial deposition tools which comprise doping profiles which are adapted to the intended field of application and which can be fabricated in a reproducible manner.

According to the present invention the silicon-germanium layer has at least one germanium rich region and at least one arsenic rich region which are separated from each other, wherein after deposition of said silicon-germanium layer and prior to a thermal heating step the germanium rich region has a peak arsenic concentration which is at least by a factor of one hundred smaller than the peak arsenic concentration in the arsenic rich region and the arsenic rich region is substantially free of germanium.

Since the Ge rich region is separated from the As rich region any interaction between these two elements has been avoided during the deposition process and the As and Ge profiles can be adapted to the intended field of application and can be reproduced in a reliable manner.

BRIEF DESCRIPTION OF THE DRAWINGS

Further features and advantages of the invention read from the following description of embodiments in accordance with the present invention and with reference to the drawings in which:

FIG. 3 shows arsenic and germanium profiles, measured by SIMS (Secondary Ion Mass Spectroscopy) of an arsenic in-situ doped silicon-germanium layer fabricated by the process according to the present invention, FIG. 4 shows a third, theoretical doping design of an arsenic in-situ doped silicon-germanium layer fabricated by the process according to the present invention, FIG. 5 shows a fourth, theoretical doping design of an arsenic in-situ doped silicon-germanium layer fabricated by the process according to the present invention, FIG. 6 shows a fifth, theoretical doping design of an arsenic in-situ doped silicon-germanium layer fabricated by the process according to the present invention, FIG. 7 shows arsenic concentration profiles in dependence upon the carbon concentration introduced into the germanium rich layer obtained by Secondary Ion Mass Spectroscopy (SIMS).

DESCRIPTION OF THE EMBODIMENTS

Figure 1:
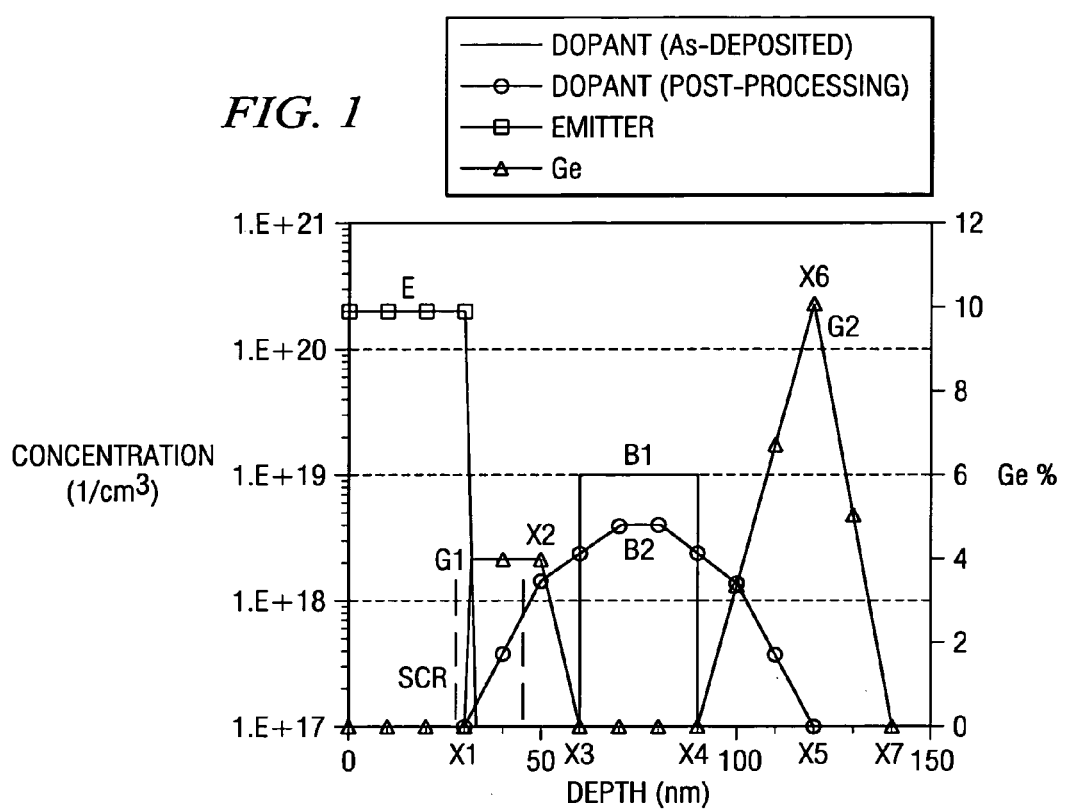
FIG. 1 shows a first, theoretical doping design of an arsenic in-situ doped silicon-germanium layer fabricated by the process according to the present invention.

FIG. 1 shows a first, theoretical doping design of an arsenic in-situ doped epitaxial silicon-germanium (SiGe) layer. According to this preferred embodiment, the SiGe layer forms the base layer of a pnp heterobipolar transistor and adjoins to the emitter layer E of the transistor. In the graph the arsenic (As) and germanium (Ge) concentrations are shown as a function of the depth of the epitaxial layer measured from the emitter surface. The SiGe layer has an As in-situ doped region which is confined between X3 and X4 and which has an average As concentration B1. The arsenic concentration B1 and the width X4–X3 of the As doped region may vary respectively in the range of $1\times10^{18}$ to $1\times10^{20}$ atoms/cm$^3$ and 30 nm to 40 nm. A first Ge rich region is confined between X4 and X7 and a second Ge rich region deposited after the first Ge rich region and the As doped region is confined between X1 and X3. The Ge profile in the first Ge rich layer is triangular-shaped and has a Ge peak concentration G2 located at X6 and a retrograding part extending between X6 and X7. The Ge profile of the second Ge rich layer has an average Ge concentration G1 between X1 and X2 and a retrograding portion extending between X2 and X3.

Instead of a triangular-shaped Ge profile in the first Ge rich region also a trapezoidal-shaped profile may be provided according to the present invention.

According to the process of the present invention As and Ge are introduced subsequently into different regions of the SiGe layer during deposition of the SiGe layer so that, as can be seen in FIG. 1 of the drawings, the As in-situ doped region is separated from the Ge rich regions thus avoiding any interaction between Ge and As during deposition of the SiGe layer. The deposition is followed by a thermal heating step in which As atoms of the As in-situ doped region diffuse into the adjoining Ge rich regions. Since As and Ge are introduced subsequently into different regions, the As and Ge profiles can be designed as desired, e.g. with the rising part and the retrograding part of the triangular-shaped Ge profile, and can be fabricated in a reproducible way.

The second Ge rich region is used to induce a band gap narrowing at the emitter-base edge thus reducing the potential barrier to hole injection into the base and yielding more charge transport from emitter-to-collector for a given emitter-base bias. The increased charge transport from emitter-to-collector results in an increased collector current density $J_C$ for a fixed bias (compared to a silicon bipolar transistor), and, as the base current density is not substantially affected by the introduced Ge, in an enhanced current gain $\beta$ of the transistor.

The Ge concentration of the second Ge rich region should remain at a constant value G1 inside the emitter-base space charge region (SCR) to minimize the 'inverse early effect'. This 'inverse Early effect' leads to a decrease of the current gain with increasing collector current and is caused by the reduction of the width of the emitter-base space charge region with increasing bias. This effect is amplified in graded-base SiGe heterobipolar transistors because the enhancement of the collector current density $J_C$ depends exponentially on the Ge concentration at the edge of the space charge region and a decrease in the width of the space charge region changes the Ge concentration at the emitter space charge region in case of a graded Ge profile in the space charge region. However, in case of a Ge profile with a constant Ge concentration G1 inside the emitter-base space charge region a change of the width of the space charge region does not lead to a change of the Ge concentration at the edge of the space charge region thus not affecting the collector current density $J_C$ due to a change of the Ge concentration at the edge of the space charge region.

The width X3–X1 of the second Ge rich region is optimized to realize an optimal trade-off between the emitter-base capacitance $C_{BE}$ to have high cutoff frequencies $f_T$ at low collector current densities $J_C$ and the emitter-base space charge region transit time. For RF applications it is important to have high cut-off frequencies $f_T$ at low collector current densities $J_C$. This can be achieved by minimizing the load time of the emitter-base capacitance which again is dominated by the emitter-base capacitance $C_{BE}$.

The retrograding part between X2 and X3 has a positive effect on the base transit time $\tau_B$ of the minority carriers which results in an enhancement of the peak cut-off frequency $f_T$ to which is referred in more detail in the next paragraph.

In most RF and microwave circuit applications, it is the transistor frequency response which limits system performance. A figure which is representative for the high frequency behavior of the transistor is the cutoff frequency $f_T$. The triangular-shaped profile of the first Ge rich region is used to improve the cut-off frequency $f_T$. The graded Ge profile between X4 and X6, i.e. the change from low Ge concentration to high Ge concentration in a direction from the emitter to the collector, induces a drift-field in the base which accelerates the minority carriers from the emitter to the collector thereby decreasing the base transit time $\tau_B$ for the minority carriers (i.e. holes in case of a pnp transistor) compared to a conventional silicon bipolar transistor. This results in an enhancement of the peak cut-off frequency $f_T$ and an improved frequency response of the fabricated transistor since $\tau_B$ is typically the limiting delay time in bipolar transistors. The peak concentration G2 at X6 has the effect of a large band-gap narrowing at the base-collector edge which is approximately located at X5 and close to X6. The retrograding part of the triangular Ge profile confined between X6 and X7 induces a valence band barrier (VBB) at the base-collector junction which can strongly impact both the DC and the AC performance of the transistor. To minimize the negative effect of the valence band barrier the retrograding part of the Ge profile is extended deep into the base-collector junction.

The triangular-shaped profile of the first Ge rich region also effects an increase of the Early Voltage $V_A$. An enhancement in the Early Voltage $V_A$ yields an improved output conductance in the device.

The thickness X4–X3 of the As rich region should be pushed at a reactor down limit thus reducing the base transit time $\tau_B$ for the minority carriers since the minority carrier mobility is small in the regions of high As doping concentration. The As peak concentration after thermal post processing is chosen to get the desired values of current gain and early voltage.

The doping design of FIG. 1 is adapted for manufacturing semiconductor devices for high-linearity applications.

Figure 2:
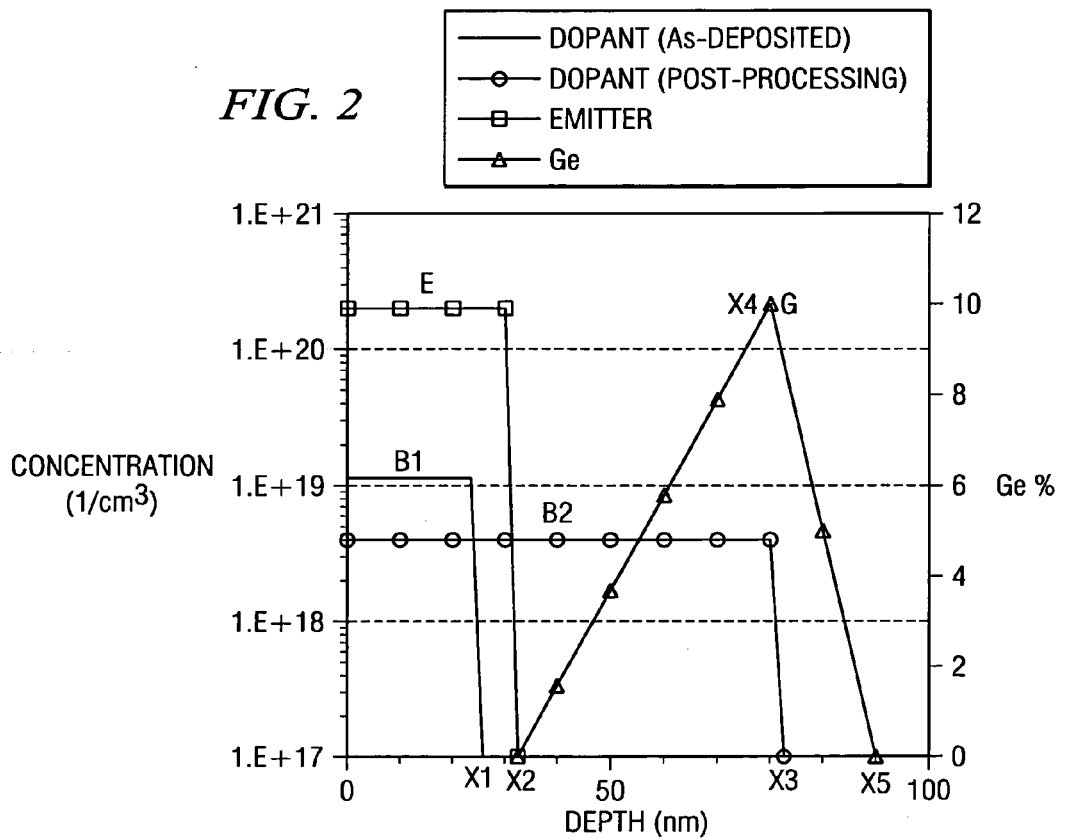
FIG. 2 shows a second, theoretical doping design of an arsenic in-situ doped silicon-germanium layer fabricated by the process according to the present invention.

The doping design shown in FIG. 2 of the drawings comprises a very thin As in-situ doped layer with an average dopant concentration B1 and a thickness X1. Between X2 and X3 a Ge rich region with a triangular Ge profile similar to that of FIG. 1 is provided. The Ge profile has a Ge peak concentration G at X4. Analogous to the Ge profile of the first Ge rich region of FIG. 1, the rising portion of the Ge profile between X2 and X4 is provided to induce a drift-field for the minority carriers thereby decreasing the base transit time $\tau_B$ compared to a conventional Si bipolar transistor and the retrograde portion of the Ge profile between X4 and X5 extends deep into the base-collector junction to reduce the negative effect of the valence band barrier. The thermal post-processing which follows the deposition of the SiGe layer makes As diffuse underneath the triangular Ge profile to the base-collector edge X3 of the transistor. The Ge peak G located at X4 is close to the base-collector edge X3.

The secondary ion mass spectroscopy (SIMS) doping profile of Si and Ge illustrated in FIG. 3 of the drawings demonstrates the feasibility of the theoretical doping design of FIG. 2. The As profile is shown as deposited and after post-processing, for example after Rapid Thermal Processing (RTP). The deposition was made using a commercial APCVD (atmospheric pressure chemical vapor deposition) reactor. Alternatively, the deposition process according to the present invention can also be made by using a RPCVD (reduced pressure chemical vapor deposition) reactor. It can be seen that the As concentration decreases from a peak concentration value of approximately $8 \times 10^{18}$ atoms/cm$^3$ to a base value of approximately $1 \times 10^{16}$ atoms/cm$^3$ in a depth of approximately 40 nm of the epitaxial layer, wherein in the same depth of the epitaxial layer the Ge concentration rises from a concentration of 0% to a peak concentration value of approximately 9%. After thermal post-processing the As profile extends into the Ge rich layer near to the Ge peak concentration. A comparison of the measured SIMS doping profiles in FIG. 3 with the theoretical doping designs of FIG. 2 shows that the SiGe layers fabricated according to the method of the present invention comprise doping profiles which substantially correspond to the theoretical doping profiles.

The doping profiles of FIGS. 2 and 3 are adapted for manufacturing semiconductor devices for high-speed high-linearity applications.

The As- and Ge-doping profiles of FIG. 4 are adapted for manufacturing semiconductor devices for superior high-speed high-linearity applications. Between a Ge rich region located between X3 and X4 and an As rich region between X1 and X2 a sequence of further As rich and Ge rich regions which each have a thickness between 1.5 nm and 4 nm are provided. The sequence of the further As rich and Ge rich regions is referred to as a staircase dopant profile. Before thermal post-processing the As profiles of the staircase dopant profile are box-shaped. After thermal post-processing, preferably rapid thermal processing to minimize the thermal budget, As of the box-shaped As profiles will diffuse into the adjacent Ge rich regions of the staircase dopant profile so that a retrograding portion is formed between X2 and X3. The box-shaped Ge rich regions of the staircase dopant profile will experience only minor changes during thermal post-processing. The triangular-shaped dopant profile of the first Ge rich region is intended to realize a band gap narrowing at the base-collector edge which is approximately located at X5 and extends deep into the base-collector junction to minimize the negative effects of the valence-band barrier on the AC performance, analogous to the triangular-shaped profiles of FIGS. 1 and 2. The desired doping profiles after thermal post-processing can be achieved without any high temperature budgets thus establishing and holding very high bipolar transistor performance.

The doping profile shown in FIG. 5 of the drawings distinguishes from the doping profile of FIG. 4 in that another Ge rich region having a box-shaped Ge profile with a thickness between 2 nm and 25 nm is provided between the emitter layer E and the As rich region between X1 and X2. This additional Ge rich region provides for further improvement in manufacturability of the epitaxial layer and in emitter-base width control during deposition.

The theoretical doping design shown in FIG. 6 of the drawings is derived from the doping design shown in FIG. 1. A thin carbon layer is introduced in the region of the rising part of the triangular-shaped Ge profile extending from X3 to X4. The carbon layer is provided for selectively increasing the As diffusivity at the base-collector edge before thermal post-processing. It is known that incorporation of carbon at low concentrations (<0.2%) in a SiGe base layer of a transistor increases As diffusivity without any impact on device performance. As is seen in FIG. 6, the thermal post-processing makes As diffuse underneath the triangular-shaped Ge profile. The low As diffusion at the emitter side results in an abrupt leading base profile which will minimize the emitter-base capacitance $C_{EB}$ without impacting the emitter-base space charge region transit time.

FIG. 7 shows by way of example the effect of a carbon enhanced layer on the As diffusion in the base layer of a transistor. The curves shown in this graph are obtained by SIMS (secondary ion mass spectroscopy). The As and Ge concentration profiles are shown as a function of the depth of the epitaxial layer. The As concentration profiles are shown prior to the subsequent thermal heating step and after the subsequent heating step. During the thermal heating step the epitaxial layer is exposed to a temperature of 1000° C. during 30 seconds. As can be seen in the graph, the As diffusion into the Ge rich layer during the annealing step depends on the carbon concentration in the Ge rich layer. The As diffusion is enhanced by the carbon introduced in the Ge rich layer. If the carbon rich layer is located near the collector, as in the doping profile of FIG. 6 of the drawings, it freezes the As near the collector thus pinning the base width.

It is also known that carbon reduces the diffusion coefficient of boron. Thus, if the carbon rich layer extends to the emitter-base edge, it inhibits the motion of emitter boron thereby pinning the emitter-base boundary.

In all above-described doping designs the total Ge dose is limited to a value which ensures stability of the deposited SiGe layer (1%–15%).

Deposition of the epitaxial silicon-germanium layers is made by using a conventional deposition tool, preferably by using a RPCVD reactor.

Deposition of the epitaxial SiGe layers is made preferably at a deposition temperature of 600° C. to 700° C. The temperature should be optimized to realize an optimal trade-off between the growth rate and the quality of the SiGe layers. The deposition time is between 20 to 30 minutes. Triangular-shaped and trapezoidal-shaped Ge profiles are achieved by varying the Ge flow during the deposition process in an adequate manner.

As can be seen in the doping design of FIG. 3 of the drawings, epitaxial As in-situ doped SiGe layers fabricated by the process according to the present invention are characterized by at least one As rich region and at least one Ge-rich region which are separated from each other, wherein after deposition of the SiGe layer and prior to thermal heating step the Ge rich region has a peak As concentration which is at least by a factor of one hundred smaller than the peak As concentration in the As rich region, and the As rich region is substantially free of Ge.

The invention claimed is:

1. A method of fabricating an epitaxial silicon-germanium layer for an integrated semiconductor device comprising the step of depositing an arsenic in-situ doped silicon-germanium layer, wherein arsenic and germanium are introduced subsequently into different regions of said silicon-germanium layer during deposition of said silicon-germanium layer to create an arsenic rich region comprising substantially no germanium wherein prior to the deposition of the arsenic rich region a first germanium rich region is deposited.

2. A method as in claim 1 wherein said arsenic rich region has a thickness between approximately 20 nm and 40 nm.

3. A method as in claim 1 wherein a second germanium rich region is deposited after deposition of said first germanium rich region and said arsenic-rich region.

4. A method as in claim 3 wherein said second germanium rich region has a thickness between approximately 2 nm and 30 nm.

5. A method as in claim 1 wherein the deposition of said first germanium rich region is carried out in such a manner that a triangular-shaped germanium profile is formed.

6. A method as in claim 1 wherein the deposition of said first germanium rich layer is carried out in such a manner that a trapezoidal-shaped germanium profile is formed.

7. A method as in claim 1 wherein after the deposition of said first germanium rich region and prior to the deposition of said arsenic rich region further arsenic rich and germanium rich regions are deposited in an alternating sequence, said arsenic rich regions and said germanium rich regions each having a thickness of approximately 1.5 nm to 4 nm.

8. A method as in claim 1 wherein germanium and carbon are introduced into a common region of said silicon-germanium layer.

9. A method as in claim 1 wherein the deposition step is followed by a thermal heating step in which arsenic of said arsenic rich region diffuses into a germanium rich region adjacent to said arsenic rich region.

10. A method as in claim 1 wherein said silicon-germanium layer is the base layer of a pnp heterobipolar transistor.

11. A method as in claim 1 wherein said silicon-germanium layer is manufactured by using a RPCVD (reduced pressure chemical vapor deposition) reactor.

12. A method of fabricating an epitaxial silicon-germanium layer for an integrated semiconductor device comprising the step of depositing an arsenic in-situ doped silicon-germanium layer by: introducing germanium to create a first germanium rich region; then introducing arsenic to create an arsenic-rich region, wherein said arsenic-rich region comprises substantially no germanium; and then introducing germanium to create a second germanium rich region, wherein the first and second germanium rich regions have an arsenic concentration which is at least a factor of a hundred smaller than a peak arsenic concentration of said arsenic rich region.

13. A method as in claim 12 wherein the deposition of said first germanium rich layer is carried out in such a manner that a trapezoidal-shaped germanium profile is formed.

14. A method as in claim 12 wherein after the deposition of said first germanium rich region and prior to the deposition of said arsenic rich region further arsenic rich and germanium rich regions are deposited in an alternating sequence, said arsenic rich regions and said germanium rich regions each having a thickness of approximately 1.5 nm to 4 nm.

15. A method as in claim 12 wherein germanium and carbon are introduced into a common region of said silicon-germanium layer.

* * * * *